United States Patent [19]

Barley et al.

[11] 4,209,786
[45] Jun. 24, 1980

[54] NEAR CARRIER AM-FM CALIBRATION TECHNIQUE

[75] Inventors: Thomas A. Barley; Gustaf J. Rast, both of Huntsville, Ala.

[73] Assignee: The United States of America as represented by the Secretary of the Army, Washington, D.C.

[21] Appl. No.: 3,175

[22] Filed: Jan. 15, 1979

[51] Int. Cl.$^2$ .................. G01S 7/40; G01R 11/02; H03F 3/14; H03C 1/52
[52] U.S. Cl. .................. 343/17.7; 331/38; 332/45; 455/109
[58] Field of Search .................. 343/17.7; 325/137; 331/38; 332/45

[56] References Cited

U.S. PATENT DOCUMENTS

| | | | |
|---|---|---|---|
| 2,961,533 | 11/1960 | Martin | 331/38 |
| 3,141,134 | 7/1964 | Osborne et al. | 325/137 |
| 3,409,832 | 11/1968 | Kessel | 332/45 |
| 3,913,013 | 10/1975 | Barley et al. | 325/329 |

Primary Examiner—S. C. Buczinski
Attorney, Agent, or Firm—Nathan Edelberg; Robert P. Gibson; Robert C. Sims

[57] ABSTRACT

Calibration technique comprises the production of a calibration signal having a single sideband of modulation which is locked to an incoming carrier. The sideband may be on either side of the carrier and is phase adjusted to be amplitude modulated, frequency modulated or a combination of the two modulation forms.

7 Claims, 11 Drawing Figures

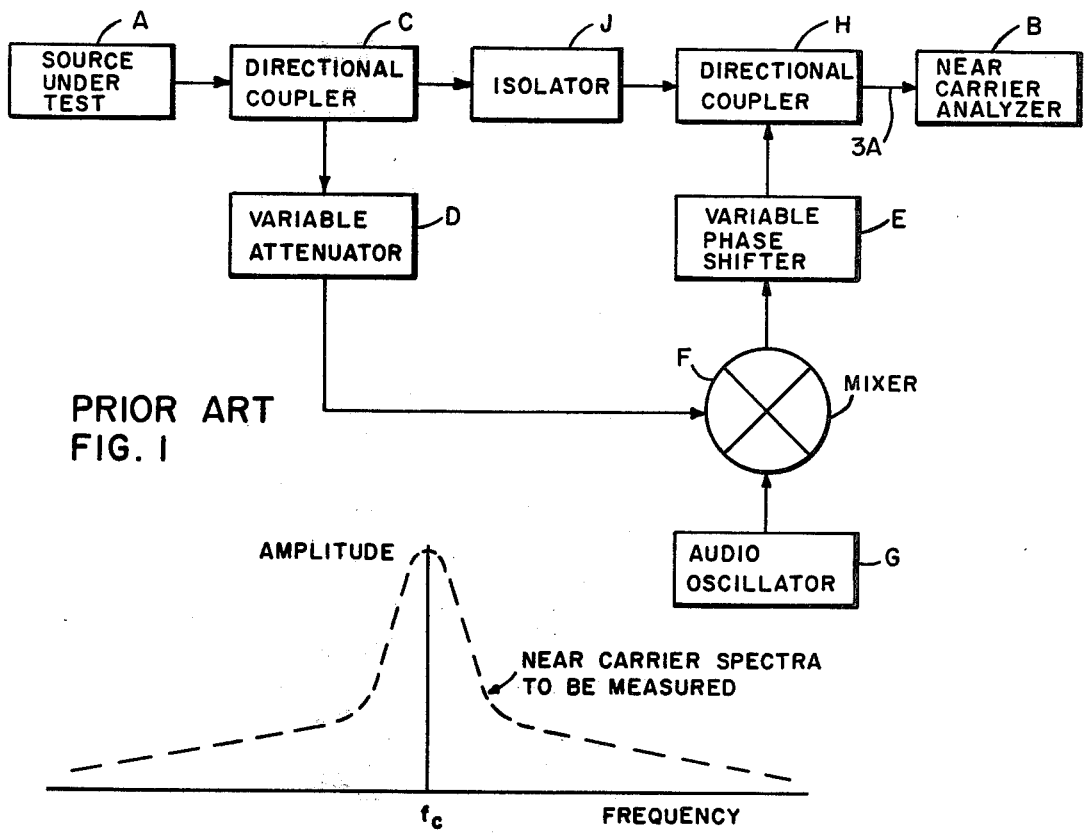
PRIOR ART
FIG. 1
FIG. 2
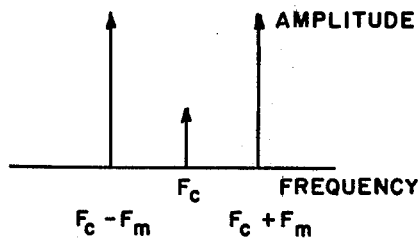
FIG. 3
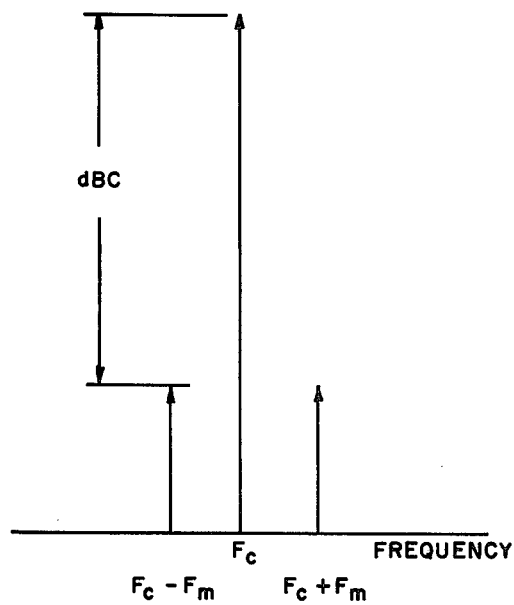
FIG. 4

NEAR CARRIER AM-FM CALIBRATION TECHNIQUE

DEDICATORY CLAUSE

The invention described herein may be manufactured, used, and licensed by or for the Government for Governmental purposes without the payment to me of any royalties thereon.

BACKGROUND OF THE INVENTION

It has been accepted practice for years to use one of four methods to calibrate near carrier spectrum analysis equipment. The first method requires the use of a known signal that can be substituted for the unknown signal. The signal used as a substitute is one that can be easily modulated directly. After the substituted signal provides the calibrated sideband band levels, the unknown signal is then reconnected for testing. A second method is a comparison technique where the discriminator is calibrated against a directly calibrated local oscillator-Intermediate Frequency discriminator of known response. The third method is to use the Bessel function nulling technique. The fourth method is to use circuitry (sometimes called an Armstrong circuit) to set up modulation sidebands that can be accurately added to the unknown signal to establish a calibration sideband pair.

The substitution technique is undesireable because it involves changing the hardware configuration between the calibration operation and the measurement operation thereby opening the way to all types of incidental errors that are very difficult to identify and correct. This causes the validity of the calibration to be open to incidental error and hence provides a questionable operation. The comparison method is unacceptable because it involves a considerable amount of manipulation that requires careful work and opportunity for many errors. Since the number of tasks required is rather large, the opportunity for error is greatly enhanced. It is also a very time consuming operation and cannot be done rapidly. The Bessel function technique is the best technique provided the source under test can be suitably modulated. The problem is that only a very few sources can be modulated in the required manner. Thus this technique is of limited usefulness. The fourth or so called Armstrong technique is easy to use and directly applicable to most cases as a means of calibration. The basic idea with this approach is to use a circuit as shown in FIG. 1, inserted between the source A and near Carrier Analyzer B to create the sideband pair. FIG. 2 depicts a typical signal with some type of modulation that represents the source to be measured. A sample of the source signal is coupled by directional coupler C through an attenuator D for amplitude control and applied to a mixer F as the local oscillator drive. A separate audio oscillator G that has variable amplitude and frequency controls is also applied to this mixer to form a sideband pair with reduced carrier amplitude as depicted in FIG. 3. The signal structure of FIG. 3 is coupled through phase shifter E, for phase control, to directional coupler where it is summed with the carrier from isolator J in the directional coupler H to produce the carrier-to-sideband relationship shown in FIG. 4. The phase shifter can create an in-phase or Amplitude Modulation, a quadrature or Frequency Modulation, or a combination of the two modulation forms. It is important to note that all the schemes discussed above generate double sideband modulation.

BRIEF DESCRIPTION OF THE DRAWINGS

FIG. 1 is a block diagram of a widely used calibration concept;
FIG. 2 is a graph of a typical signal source,
FIG. 3 is a graph of a typical sideband signal for calibration;
FIG. 4 is a graph illustrating a typical sideband for calibration as seen at the output of directional coupler H of FIG. 1.

DESCRIPTION OF THE PREFERRED EMBODIMENT

The calibration technique described herein is unique in at least three respects. This calibration signal forms a single sideband of modulation on the carrier traveling through the calibration circuitry. This is a feature totally different from other modulation techniques which form a sideband air thus creating double sideband modulation. This single sideband technique is arranged to provide a sideband that is locked to the incoming carrier. This locking feature permits placing the sideband at almost any frequency with respect to the carrier, limited only the components used to form the calibration circuitry. Thus the sideband may be on either side of the carrier and may be phase adjusted to be Amplitude modulated, Frequency modulated or a combination of the two modulation forms. In addition, this circuitry provides the capability to easily simulate either a closing or receeding doppler signal permitting an easily assembled doppler generator that could be used to provide active testing of radar systems.

Figure 5:
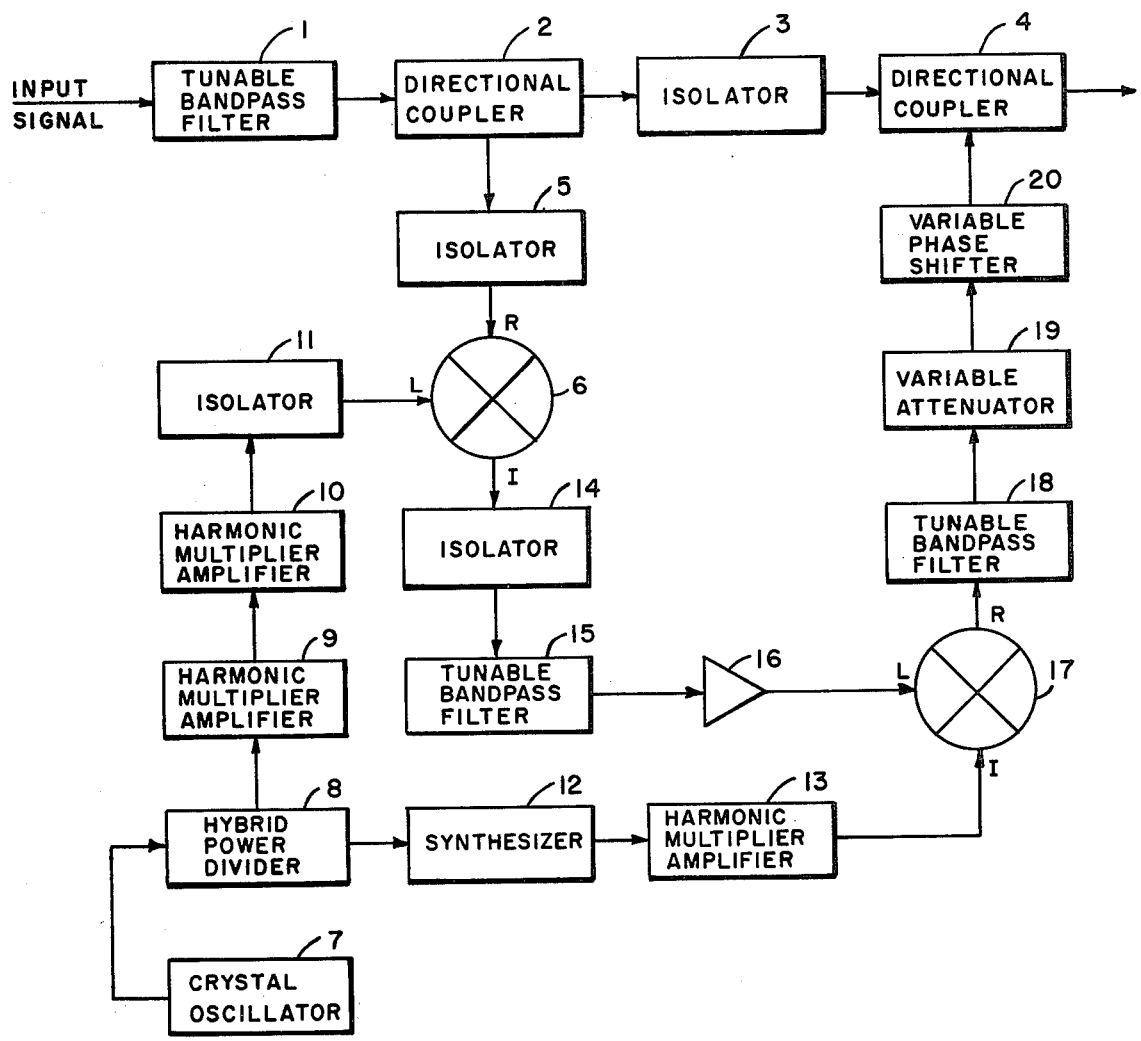
FIG. 5 is a block diagram showing a single sideband calibrator in accordance with the present invention.
Figure 6:
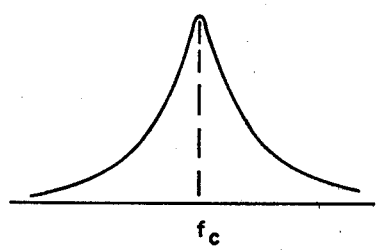
FIG. 6 is an illustration of a general input signal with some sidebands.
Figure 7:
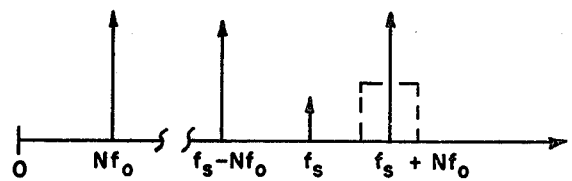
FIG. 7 shows an output signal from the I port of mixer 6 in FIG. 5.
Figure 8:
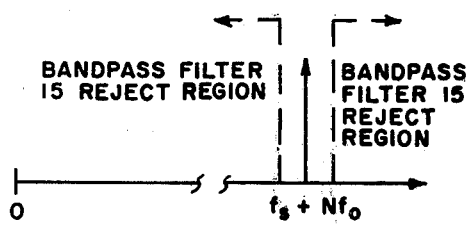
FIG. 8 shows the band pass filter frequency selection operation.
Figure 9:
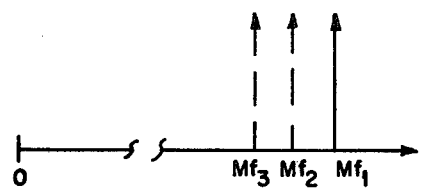
FIG. 9 shows the signal into the I port of mixer 17 of FIG. 5.
Figure 10:
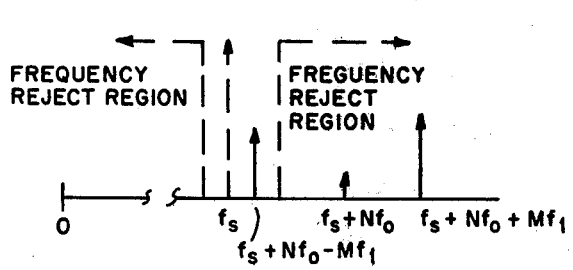
FIG. 10 illustrates the frequency spectrum at the R port of mixer 17 in FIG. 5.
Figure 11:
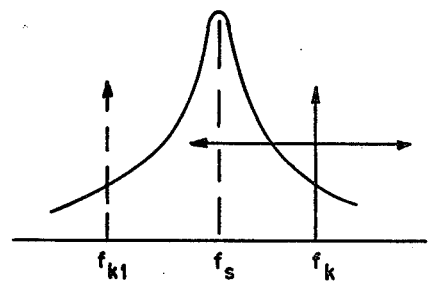
FIG. 11 shows the recombined signal with the added sideband.

Referring to FIG. 5, an input signal which may have a near carrier spectral density distribution such as shown in FIG. 6 is applied to the Tunable bandpass filter 1. This filter may not be needed in cases where the input spectrum is known to be clear of all energy except the desired input signal but in a general case, a bandpass filter is necessary to insure a controlled input condition. After traversing the bandpass filter, the signal has a portion split off by directional coupler 2 and applied to mixer 6 through isolator 5 which insures adequate decoupling between the mixer and the input signal path. The main portion of the input signal continues through directional coupler 2 and through isolator 3 to directional coupler 4. Isolator 3 prevents back coupling between the signals in directional coupler 2 and directional coupler 4. A very stable crystal oscillator 7 with good near carrier noise characteristics is used as a signal source to generate the single sideband signal. The signal from the crystal oscillator 7 goes to hybrid 8 where it is divided into two different signal paths. This two path implementation permits a signal to be generated that is fixed in frequency and a signal to be generated that can be changed as desired. (This is the key to generation of a variable frequency positioned as desired with respect to the input signal at tunable bandpass filter 1.) The signal that exits hybrid power divider 8 goes to harmonic multiplier amplifier 9 which generates a series of harmonics of the applied input. Harmonic multiplier amplifier 9 in some cases may also contain a bandpass filter, however in most cases the extra harmonics that are emitted from harmonic multiplier amplifier 9 should not interfer with operation of harmonic multiplier amplifier 10. The reason for two harmonic multiplier amplifier units is to provide more flexibility for the signal frequency at mixer 6. Both harmonic multiplier amplifier units 9 and 10 are functionally the same kind of device. The hardware may have to change in configuration because of the frequencies involved but conceptually and functionally both units are identical. The signal output from harmonic multiplier amplifier 10 is routed through isolator 11 to insure signal power decoupling between the harmonic multiplier amplifier 10 and mixer 6. The signals at the L and R ports of mixer 6 are mixed and a sum or difference frequency output is emitted from the I port. FIG. 7 depicts a general case of the type signals that appear at mixer 6 I port. $Nf_o$ is the harmonic derived from crystal oscillator 7 that is applied to the L port of mixer 6. $f_s$ is the signal input coming from isolator 5. It is noted that only one of the samples of the output from harmonic multiplier amplifier 10 ($Nf_o$) is shown. It is understood that a large number of $Nf_o$ signal samples are available for the mix process in mixer 6. This is part of the inherent flexibility of this device. For purposes of this discussion, we will arbitrarily select the $f_s+Nf_o$ for describing operation of this device. (Note that $f_s-Nf_o$ could have been chosen). Ths signal at the I port of mixer 6 is sent through isolator 14 to tunable bandpass filter 15. Bandpass filter 15 is the element that selects the signal that is to be used. It rejects and heavily attenuates all other components that may have been generated up to this point. This signal selection capability is shown in FIG. 7 by the dashed line and again in FIG. 8 which illustrates what the bandpass filter 15 does. Band pass filter 15 outputs a single frequency that is amplified in amplifier 16 and applied to the local oscillator port of mixer 17. Starting again at hybrid power divider 8, a signal is output to synthesizer 12 as a reference upon which the synthesis process is based. The output of synthesizer 12 is selectable. For example some commercial units such as an HP-8640 or equivalent type device could be used as synthesizer 12. The selectable signal from synthesizer 12 is applied to harmonic multiplier amplifier 13 to feed the I port of mixer 17. FIG. 9 (which is not to any frequency or amplitude scale) is used to depict the fact that a very large number of frequency positions can be outputed; one for each setting of Synthesizer 12. These are then applied to harmonic multiplier amplifier 13. Harmonic multiplier amplifier 13 is functionally the same type device as harmonic multiplier amplifiers 9 and 10. The outputs from harmonic multiplier amplifier 13 are frequencies that are $Mf_1$, $Mf_2$, $Mf_3$, etc. Harmonics of the synthesizer 12 output at some value of multiplication M. The output of harmonic multiplier amplifier 13 is used to drive the I port of mixer 17. At the R port of mixer 17, a set of mixed signal outputs are available in a unique relationship to the signal that was applied to bandpass filter 1. The signals feeding the L port and I port of mixer 17 are always selected in a manner that places an output signal near (in the near carrier region) the input signal frequency that was applied to bandpass filter 1. One possible selection of mixing frequencies could result in the arrangement shown in FIG. 10. The R port of mixer 17 feeds bandpass filter 18 that selects the original input signal $f_s$ and one mix sideband from mixer 17 in the bandpass region. The output signal from bandpass filter 18 is the $f_s+Nf_o-Mf_1$. $f_s$ as shown in FIG. 10 is added only to establish a relative relationship between the input signal to bandpass filter 1 and the signal output from bandpass filter 18. Bandpass filter 18 output goes through attenuator 19 which provides amplitude control of the signal output from bandpass filter 18 and thence through a phase shifter 20 that can rotate the relative phase of the signal output from bandpass filter 18. The output from phase shifter 20 is applied to directional coupler 4 which combines this signal with the original signal, at bandpass filter 1 input. A pictorial concept of the combined signal in directional coupler 4 is shown in FIG. 11. Several things that are unique about this type of sideband generation can be obtained by simple selection of frequencies and settings in amplitude and phase. (1) Because $f_k$ is selectable and through the double mixing process directly related to the input signal $f_s$, $f_k$ can be positioned in a wide variety of positions with respect to $f_s$ and still be operationally tied to $f_s$. (2) $f_k$ can be positioned over a large dynamic range of amplitudes without affecting the relationship of $f_s$, i.e., $f_k$ can be controlled in amplitude without distorting the parameters of $f_s$. (3) The phase shift function in phase shifter 20 permits the $f_k$ sideband to be added to $f_s$ in virtually any vectorially directed position. This permits the use of $f_k$ as an FM sideband, an AM sideband or vectorially split with both an FM and AM component set. (4) This arrangement permits a true single sideband calibration with either AM or FM modulation or with a combination of both. (5) This device can easily be used to simulate a variety of doppler operations both as a mechanism for laboratory use and as a simulator to test operational equipment such as doppler radars. (6) This method, unlike other techniques, does not have a residual carrier and sideband set resulting from a phasing and feed error limit because signals can be separated sufficiently to insure adequate suppression of undesired signals. (7) This concept is flexible in that a wide range of operational parameters can be generated through proper use and selection of parameters.

We claim:

1. A method of generating a near carrier single sideband comprising the steps of sampling a main carrier signal; generating a driving signal; mixing the driving signal and the main signal for producing a combined signal; using the driving signal to supply a synthesizer so as to produce an offset frequency from the main signal; and adding the combined signal to the offset frequency and sending them through a bandpass selecting device so as to select a single sideband and sending it back to the main signal for combining to produce a near carrier single sideband.

2. The method as set forth in claim 1 further comprising the steps of matching the main signal amplitude with the offset frequency by attenuating said offset frequency.

3. A method as set forth in claim 2 further comprising the step of using the same driving signal for the synthesizer as for the combined signal operation.

4. A method as set forth in claim 3 further comprising the steps of isolating the sampling of the main signal and isolating the driving signal.

5. In a system having a main signal supply path, the improvement comprising a first coupler connected to said main signal supply path whereby a portion of the main signal will be sampled; first mixer means having one input connected to said coupler; a supply source connected to a hybrid means having first and second outputs; the first output of said hybrid means being connected to a second input of said first mixer means whereby an output of said mixer means will produce an output which is proportional to differences and sums in its two inputs; a synthesizer means having an input connected to the second output of said hybrid means; a second mixer means having first and second inputs and an output; an output of said synthesizer means being connected to the first input of said second mixer means; an output of said first mixer means being connected to the second input of said second mixer means whereby the output of said second mixer means will be the output of the synthesizer means combined with the output of said first mixer means; a tunable bandpass filter; an attenuator means; a second coupler having a first input and an output in the main supply path and a second input being connected through said attenuator means, and said bandpass filter to the output of said second mixer means whereby a signal will be added to the main signal supply path in accordance with the output of the synthesizer means and the adjustment of said attenuator means and said bandpass filter.

6. A system as set forth in claim 5 further comprising a first isolator means connected between said first coupler and said first mixer means; a second isolator means connected between the first output of said hybrid means and said first mixer means; and a third isolator means connected between the output of said first mixer means and said second mixer means.

7. A system as set forth in claim 6, further comprising a first harmonic multiplier connected between said second isolator means and said hybrid means; a second harmonic multiplier connected between said synthesizer means and said second mixer means; and variable phase shifter connected between said attenuator and said second coupler.

* * * * *